US006948964B2

(12) United States Patent
Lee

(10) Patent No.: US 6,948,964 B2
(45) Date of Patent: Sep. 27, 2005

(54) ELECTRONIC CARD CONNECTOR WITH FIXED LATERAL ARMS

(75) Inventor: Ipson Lee, Taoyuan (TW)

(73) Assignee: Super Link Electronics Co., Ltd., Taoyuan (TW)

( * ) Notice: Subject to any disclaimer, the term of this patent is extended or adjusted under 35 U.S.C. 154(b) by 0 days.

(21) Appl. No.: 10/761,356

(22) Filed: Jan. 22, 2004

(65) Prior Publication Data

US 2005/0164539 A1 Jul. 28, 2005

(51) Int. Cl.[7] .............................................. H01K 13/62
(52) U.S. Cl. ...................................................... 439/328
(58) Field of Search ................................ 439/328, 157, 439/326, 92

(56) References Cited

U.S. PATENT DOCUMENTS 6,027,357 A * 2/2000 Howell et al. .............. 439/326
6,162,069 A * 12/2000 Choy .......................... 439/92
6,164,998 A * 12/2000 Poi et al. .................... 439/326
6,234,821 B1 * 5/2001 Tan ............................ 439/328
6,464,514 B1 * 10/2002 Tsai et al. ..................... 439/92
6,663,407 B1 * 12/2003 Pickles ....................... 439/328

* cited by examiner

*Primary Examiner*—Ross Gushi
*Assistant Examiner*—X. Chung Trans
(74) *Attorney, Agent, or Firm*—Rosenberg, Klein & Lee

(57) ABSTRACT

An electronic card connector with fixed lateral arms, including: a plastic main body in which multiple terminals are inlaid, at least one lateral arm projecting from each side of the main body, the two lateral arms defining therebetween an electronic card receptacle, a stopper block being formed on each lateral arm; and at least two resilient members respectively fitted on outer sides of the lateral arms. Each resilient member has a bent stopper board section projecting from the resilient member. The stopper board section projectively extends to the inner side of the lateral arm and is positioned above the electronic card receptacle.

8 Claims, 5 Drawing Sheets

ELECTRONIC CARD CONNECTOR WITH FIXED LATERAL ARMS

BACKGROUND OF THE INVENTION

1. Field of the Invention

The present invention is related to an electronic card connector with fixed lateral arms. During the procedure of insertion or taking out of the electronic card, it is unnecessary to outward bias the lateral arms on two sides of the plastic main body. Therefore, the lateral arms are protected from being broken or damaged. Accordingly, the using life of the electronic card connector can be prolonged.

2. Description of the Prior Art

FIG. 10 shows a connector applied to a conventional electronic card. The connector includes a plastic main body 91. Multiple terminals 911 are side by side inlaid in the base section of the main body 91 for electrically connecting with an inserted electronic card. Two lateral arms 912 respectively extend from two sides of the main body 91. The connector further includes two fixing resilient plates 92. Each fixing resilient plate 92 has an insertion plate 921 inserted in the main body 91. A sidewall 923 radially projects from the fixing resilient plate 92. The sidewall 923 attaches to outer side of the lateral arm 912 of the main body 91 for reinforcing the lateral arm 912. In use, when taking out the electronic card, the lateral arms 912 are outward stretched. At this time, the fixing resilient plates 92 serve to prevent the lateral arms 912 from breaking. In addition, a connecting plate 922 downward projects from the fixing resilient plate 92 for adhering to the surface of a circuit board.

The above connector structure has some shortcomings as follows:

1. The lateral arm 912 of the plastic main body 91 is a quite elongated cantilever made of plastic material and having weak structural strength. Therefore, when inserting the insertion plate 921 of the fixing resilient plate 92 into the insertion hole 913 of the lateral arm 912, the lateral arm 912 is subject to breakage.
2. In use, when taking out the electronic card, it is necessary to outward stretch the lateral arms 912 which have weak structural strength. As a result, the lateral arms 912 are likely to break due to improper application force. This will end the using life of the connector.
3. The fixing resilient plate 92 lacks any grounding structure for contacting with the inserted electronic card to form a grounding circuit. Therefore, the quality of output signal of the electronic card will be affected.
4. When inserting the insertion plate 921 of the fixing resilient plate 92 into the insertion hole 913 of the plastic main body 91, the insertion plate 921 tends to be biased. This will deflect the connecting plate 922 to exceed the specification. As a result, the connecting plate 922 can hardly correctly contact with the circuit board (not shown) positioned thereunder. Therefore, in the case that the fixing resilient plate 92 is inserted in the main body 91 in a biased state and then adhered to the circuit board, a defective product with poor contact is produced.

SUMMARY OF THE INVENTION

It is therefore a primary object of the present invention to provide an electronic card connector with fixed lateral arms. The electronic card connector includes: a plastic main body in which multiple terminals are inlaid, at least one lateral arm projecting from each side of the main body, the two lateral arms defining therebetween an electronic card receptacle, a stopper block being formed on each lateral arm; and at least two resilient members respectively fitted on outer sides of the lateral arms. Each resilient member has a bent stopper board section projecting from the resilient member. The stopper board section projectively extends to the inner side of the lateral arm and is positioned above the electronic card receptacle. When a user places in an electronic card from upper side to lower side, two sides of the electronic card first outward resiliently stretch the resilient members and then the stopper blocks of the lateral arms are correspondingly engaged in two locating dents formed on two sides of the electronic card. At this time, the electronic card is prevented from retreating. After the electronic card is firmly engaged with the lateral arms, the resilient members resiliently restore to their home positions. At this time, the stopper board sections of the resilient members abut against upper side of the electronic card to prevent the electronic card from skipping upward. During insertion of the electronic card, the plastic-made lateral arms will not be outward pushed so that the lateral arms are prevented from breaking. Therefore, the using life of the electronic card connector can be prolonged.

The present invention can be best understood through the following description and accompanying drawings wherein:

DETAILED DESCRIPTION OF THE PREFERRED EMBODIMENTS

Figure 1:
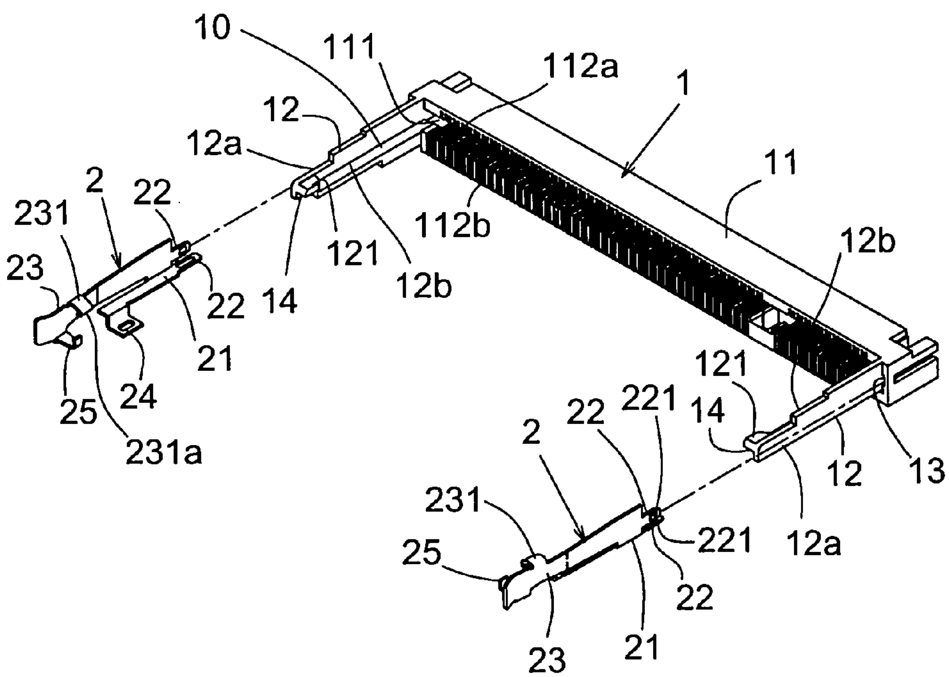
FIG. 1 is a perspective exploded view of the present invention.
Figure 2:
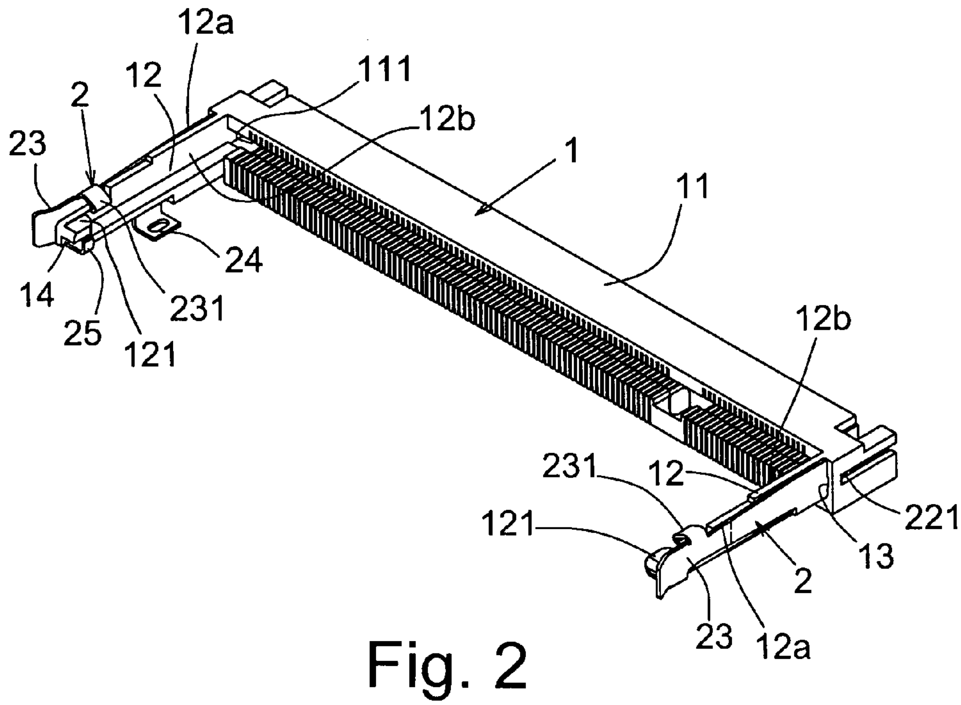
FIG. 2 is a perspective assembled view of the present invention.

Please refer to FIGS. 1 to 5. The present invention includes: a plastic main body 1 in which multiple terminals are inlaid, at least one lateral arm 12 projecting from each side of the main body 1, the two lateral arms 12 defining therebetween an electronic card receptacle 10, a stopper block 121 being formed on each lateral arm 12; and at least two resilient members 2 respectively fitted on outer sides 12*a* of the lateral arms 12. Each resilient member 2 has a bent stopper board section 231 projecting from the resilient member 2. The stopper board section 231 projectively extends to the inner side 12*b* of the lateral arm 12 and is positioned above the electronic card receptacle 10. When a user places in an electronic card 3 from upper side to lower side, the electronic card 3 first outward resiliently stretches the resilient members 2 and then the stopper blocks 121 of the lateral arms 12 are correspondingly engaged in two locating dents 31 formed on two sides of the electronic card 3. At this time, the electronic card 3 is prevented from retreating. After the electronic card 3 is firmly engaged with the lateral arms 12, the resilient members 2 resiliently restore to their home positions. At this time, the stopper board sections 231 abut against upper side of the electronic card 3 to prevent the electronic card 3 from skipping upward. During insertion of the electronic card 3, the plastic-made lateral arms 12 will not be outward pushed so that the lateral arms 12 are prevented from breaking. Therefore, the using life of the electronic card connector can be prolonged.

Referring to FIGS. 1 to 4, the plastic main body 1 is integrally molded, having a base section 11. An insertion socket 111 is formed on one side of the base section 11. A front edge of the electronic card 3 can be snugly inserted into the insertion socket 111. The upper and lower sides of the insertion socket 111 are respectively parallelly formed with multiple terminal cavities 112*a*, 112*b* for inlaying multiple terminals 113*a*, 113*b* therein. The terminals 113*a*, 113*b* serve to electrically connect with the circuit of the inserted electronic card 3. The two lateral arms 12 project from two sides of the base section 11. At least two insertion caves 13 are formed on two ends of the base section 11. Each resilient member 2 has an insertion section 22 which can be snugly inserted in the insertion cave 13.

The lateral arm 12 of the plastic main body 1 has an L-shaped cross-section for enhancing the bending strength of the lateral arm 12. However, the shape of the cross-section of the lateral arm 12 is not limited.

The resilient member 2 is made of metal panel by integral punch. The resilient member 2 has a base board section 21 and at least one insertion section 22 projecting from front edge of the base board section 21. The insertion section 22 can be correspondingly inserted into the insertion cave 13 of the plastic main body 1. A resilient arm 23 longitudinally extends from a lateral edge of the base board section 21 for attaching to the outer side 12*a* of the lateral arm 12 of the plastic main body 1. A stopper board section 231 projects from top edge of the resilient arm 23 toward the lateral arm 12. The stopper board section 231 is projectively positioned above the electronic card receptacle 10 of the plastic main body 1.

A bent grounding plate 24 extends from the other lateral edge of the base board section 21 for connecting with a grounding circuit of a circuit board (not shown). Therefore, the electronic card 3 inserted in the connector is grounded to avoid damage of the electronic card 3 due to instantaneous charge.

A free end of the resilient arm 23 is formed with a bent locating hook section 25. At normal time, the locating hook section 25 extends in a locating recess 14 of the plastic main body 1. After the resilient arm 23 is outward biased by a certain angle, the locating hook section 25 abuts against a sidewall of the locating recess 14 to prevent the resilient arm 23 from being further outward biased. Therefore, the outward biasing angle of the resilient arm 23 is limited.

The insertion section 22 is punched with at least one reverse hook section 221 for tightly latching in the corresponding insertion cave 13 of the plastic main body 1. Accordingly, the resilient member 2 is effectively prevented from being retreated.

The outer end of the stopper board section 231 of the top edge of the resilient arm 23 is downward bent to form an arched face or slope 231*a* for guiding the electronic card 3 to be smoothly pressed into the electronic card receptacle 10. Also, when the electronic card 3 is pressed downward, the resilient arm 23 of the resilient member 2 can be smoothly outward biased.

Figure 3:
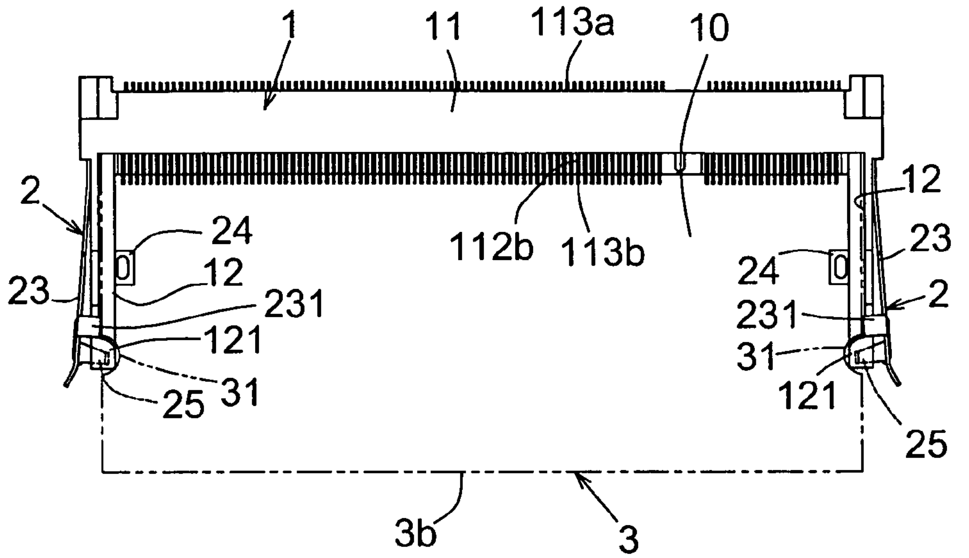
FIG. 3 is a top view showing that the electronic card is being inserted into the electronic card connector of the present invention.
Figure 4:
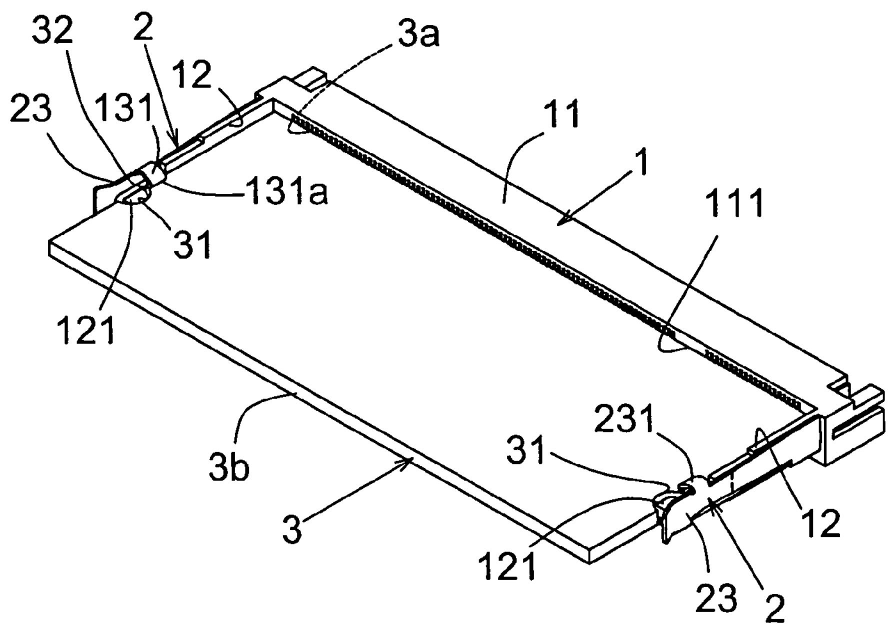
FIG. 4 is a perspective view showing that the electronic card has been inserted in the electronic card connector of the present invention.
Figure 5:
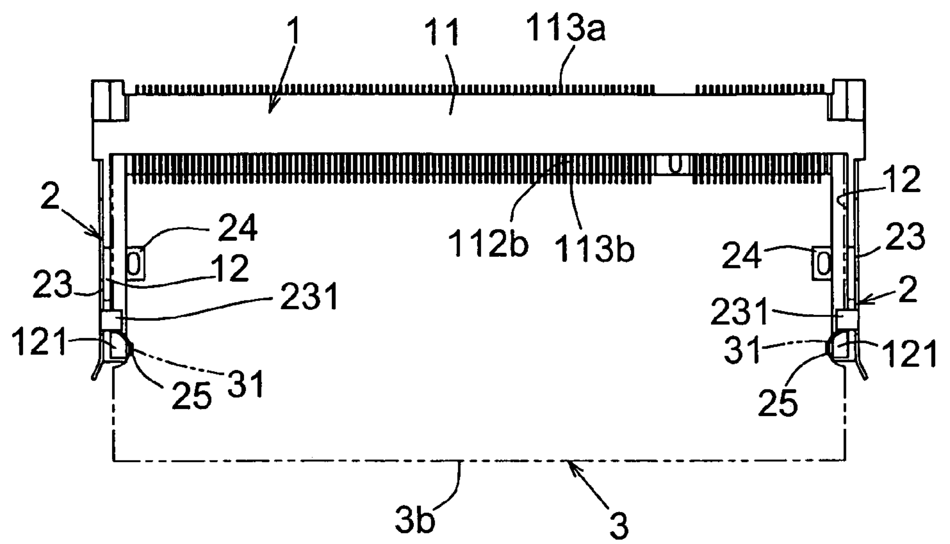
FIG. 5 is a top view according to FIG. 4.
Figure 6:
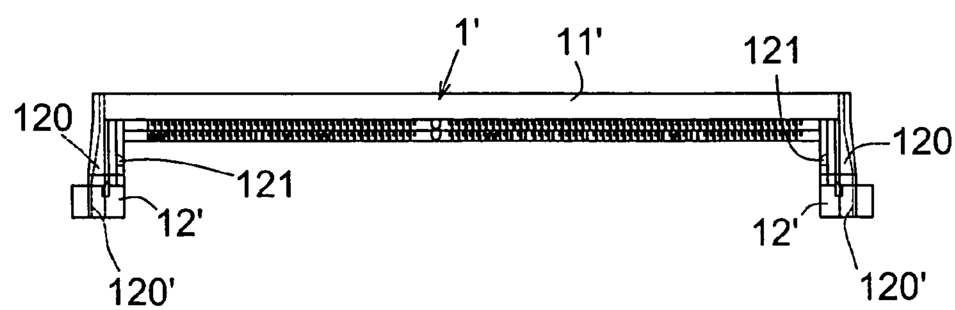
FIG. 6 shows the plastic main body of a second embodiment of the present invention.
Figure 9:
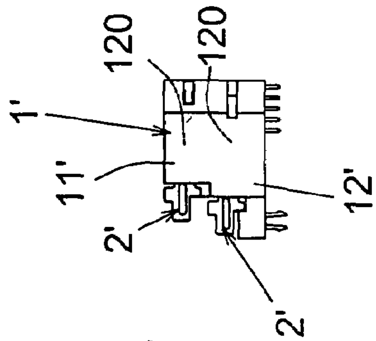
FIG. 9 is a side view according to FIG. 8.
Figure 7:
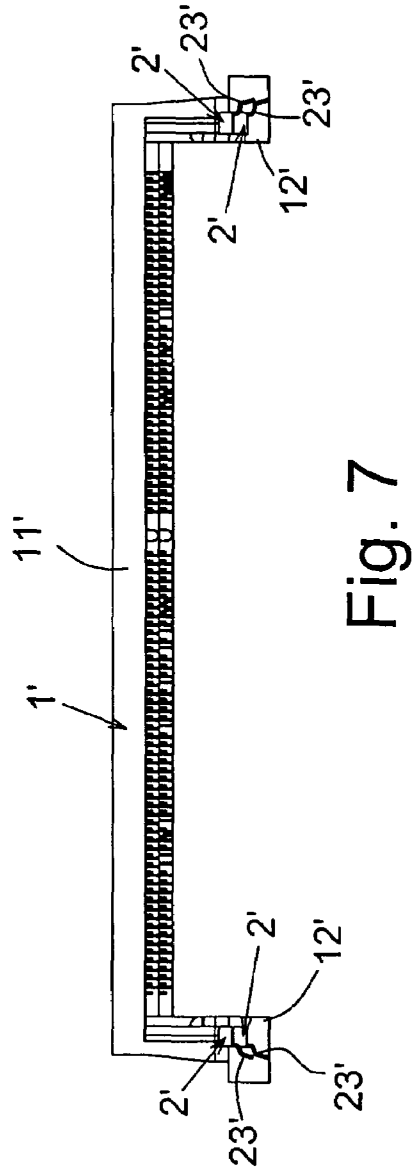
FIG. 7 shows the connector of the second embodiment of the present invention.
Figure 8:
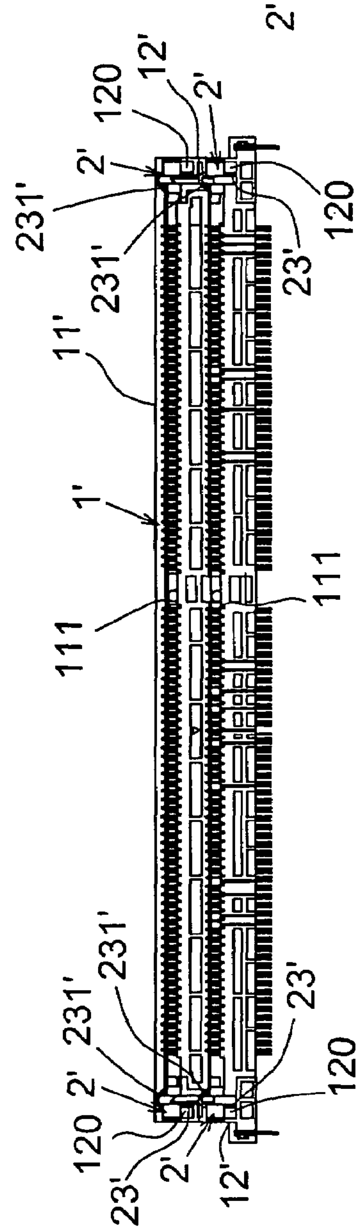
FIG. 8 is a front view according to FIG. 6.
Figure 10:
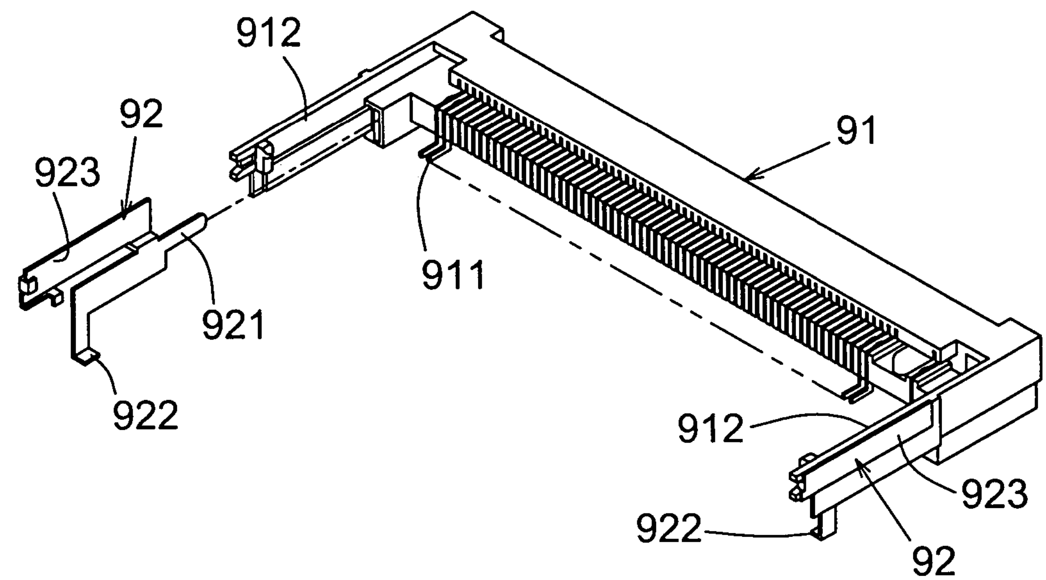
FIG. 10 is a perspective view of a conventional electronic card connector.

Referring to FIGS. 3, 4 and 5, in application of the present invention, a user first inserts the front end 3*a* of the electronic card 3 into the insertion socket 111 of the base section 11 of the plastic main body 1. Then, the rear end 3*b* of the electronic card 3 is pressed down. At this time, two sides of the electronic card 3 will outward push the resilient arms 23 of the two resilient members 2, whereby the electronic card 3 can be smoothly slid into the electronic card receptacle 10. At the same time, the stopper blocks 121 of the two lateral arms 12 of the plastic main body 1 are correspondingly engaged in the locating dents 31 of two sides of the electronic card 3, whereby the electronic card 3 is prevented from being retreated. After the electronic card 3 is totally moved into the electronic card receptacle 10, the resilient arms 23 of the resilient members 2 are no more pushed and will automatically resiliently restore to their home positions. At this time, the stopper board sections 231 of the resilient arms 23 abut against upper side of the electronic card 3 to prevent the electronic card 3 from skipping upward. In addition, the stopper board sections 231 are connected with the grounding contacts 32 of the electronic card 3 to complete the grounding loop of the electronic card 3.

When the user wants to take out the electronic card 3, as shown in FIGS. 4 and 5, the resilient arms 23 of the resilient members 2 are outward biased into a state as shown in FIG. 3. Under such circumstance, the stopper board sections 231 of the resilient arms 23 are no more projectively positioned above the electronic card receptacle 10. At this time, the user can easily lightly push the electronic card 3 upward and take out the same. During the procedure of insertion or taking out of the electronic card 3, it is unnecessary to stretch the lateral arms 12 on two sides of the plastic main body 1. Therefore, the plastic-made lateral arms 12 are protected from being broken. Accordingly, the using life of the connector can be prolonged.

The structure of the present invention is not only applicable to the one-layer electronic card connector as shown in FIGS. 1 to 5, but also is applicable to a two-layer or multilayer electronic card connector as shown in FIGS. 6 to 9. This is not limited.

Referring to FIGS. 6 to 9, in a second embodiment of the present invention, the base section 11' of the plastic main body 1' has two or more insertion sockets 111. Two lateral arms 12' project from two sides of the base section 11'. At least two resilient members 2' are fitted on outer side of each lateral arm 12'. The two resilient members 2' are arranged on upper side and lower side. The lateral arm 12' of the plastic main body 1' is further formed with a cave 120 in which the front section of the resilient member 2' is received. The resilient arm 23' of the resilient member 2' can be outward biased within the cave 120. When the resilient arm 23' is outward biased to abut against a cave wall 120' of the cave 120, the stopper board section 231' of top edge of the resilient arm 23' projectively totally leaves the upper side of the electronic card receptacle 10 defined between the two lateral arms 12'. By means of the stop of the cave 120, the maximum outward biasing angle of the resilient arm 23' of the resilient member 2' is limited. Accordingly, the resilient arm 23' is prevented from being deformed.

The electronic card connector with fixed lateral arms of the present invention is mainly characterized in that during the procedure of insertion or taking out of the electronic card 3, it is unnecessary to outward bias the lateral arms 12 or 12' on two sides of the plastic main body 1 or 1'. Therefore, the lateral arms 12 are protected from being broken or damaged. Accordingly, the using life of the electronic card connector can be prolonged.

The above embodiments are only used to illustrate the present invention, not intended to limit the scope thereof. Many modifications of the above embodiments can be made without departing from the spirit of the present invention.

What is claimed is:

1. An electronic card connector with fixed lateral arms, comprising:

(a) a plastic main body having a base section, at least one insertion socket being formed on one side of the base section, whereby a front edge of an electronic card can be snugly inserted into the insertion socket, the insertion socket having an upper side and a lower side being respectively parallelly formed with multiple terminal cavities for inlaying multiple terminals therein, the plastic main body has two lateral arms each having opposing first and second ends and inner and outer sides, the first end of the lateral arms being respectively disposed at two sides of the base section, whereby an electronic card receptacle is defined between the inner sides of the two lateral arms, a stopper block being disposed on each lateral arm, at least two insertion caves being formed on two ends of the base section; and (b) resilient members each having a base board section and at least one insertion section projecting from a front edge of the base board section and respectively inserted in a corresponding insertion cave of the plastic main body adjacent the first end of a respective lateral arm, each resilient member having a resilient arm extending longitudinally from the base board section adjacent the outer side of the respective lateral arm, each resilient member having a distal end being freely and resiliently displaceable away from the second end of the respective lateral arm when being outwardly biased, each resilient arm having a stopper board section projecting from a top edge thereof toward the corresponding lateral arm.

2. The electronic card connector with fixed lateral arms as claimed in claim 1, wherein the lateral arm of the plastic main body has an L-shaped cross-section.

3. The electronic card connector with fixed lateral arms as claimed in claim 1, wherein a bent grounding plate extends from the other lateral edge of the base board section of the resilient member for connecting with a grounding circuit of a circuit board.

4. The electronic card connector with fixed lateral arms as claimed in claim 1, wherein the distal end of the resilient arm of the resilient member is formed with a bent locating hook section, whereby at normal time, the locating hook section extends in a locating recess of the plastic main body, after the resilient arm is outward biased by a certain angle, the locating hook section abutting against a sidewall of the locating recess to prevent the resilient arm from being further outward biased.

5. The electronic card connector with fixed lateral arms as claimed in claim 1, wherein the insertion section of the resilient member is punched with at least one reverse hook section.

6. The electronic card connector with fixed lateral arms as claimed in claim 1, wherein an outer end of the stopper board section of the top edge of the resilient arm is downwardly bent to form an arched face.

7. The electronic card connector with fixed lateral arms as claimed in claim 1, wherein an outer end of the stopper board section of the top edge of the resilient arm is downwardly bent to form a slope.

8. The electronic card connector with fixed lateral arms as claimed in claim 1, wherein each lateral arm of the plastic main body is formed with at least one cave in which a resilient member is received, whereby the resilient arm of the resilient member can be outwardly biased within the cave, when the resilient arm is outwardly biased to abut against a cave wall of the cave, the stopper board section of top edge of the resilient arm projectively totally leaving the upper side of the electronic card receptacle defined between the two lateral arms.

* * * * *